United States Patent
Lee et al.

(10) Patent No.: US 8,222,944 B2
(45) Date of Patent: Jul. 17, 2012

(54) DC OFFSET CANCELLATION CIRCUIT

(75) Inventors: Young Jae Lee, Daegu (KR); Sang Sung Lee, Daejeon (KR); Sang-Gug Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 58 days.

(21) Appl. No.: 12/950,193

(22) Filed: Nov. 19, 2010

(65) Prior Publication Data

US 2011/0121880 A1 May 26, 2011

(30) Foreign Application Priority Data

Nov. 20, 2009 (KR) .................. 10-2009-0112802
Mar. 24, 2010 (KR) .................. 10-2010-0026184

(51) Int. Cl.
*H03L 5/00* (2006.01)
(52) U.S. Cl. ....................................... 327/307
(58) Field of Classification Search .................. 327/307
See application file for complete search history.

(56) References Cited

U.S. PATENT DOCUMENTS

| 7,006,813 B2 | 2/2006 | Staszewski et al. | |
| 7,556,327 B2 * | 7/2009 | Gardner | 347/9 |
| 2007/0105522 A1 | 5/2007 | Muhammad et al. | |

OTHER PUBLICATIONS

Muhammad, K. et al., "Joint common mode voltage and differential offset voltage control scheme in a low-IF receiver", Radio Frequency Integrated Circuits (RFIC) Symposium, 2004. Digest of Papers. IEEE, Jun. 6-8, 2004, pp. 405-408.
Muhammad, K. et al, "The First Fully Integrated Quad-Band GSM/GPRS Receiver in a 90-nm Digital CMOS Process", IEEE Journal of Solid-State Circuits, Aug. 2006, vol. 41, No. 8, pp. 1772-1783.

* cited by examiner

*Primary Examiner* — Lincoln Donovan
*Assistant Examiner* — William Hernandez
(74) *Attorney, Agent, or Firm* — Rabin & Berdo, P.C.

(57) ABSTRACT

A DC offset cancellation circuit includes: a control signal generation unit generating i (i is a natural number) number of pulse signals having a pulse width corresponding to a DC offset amount; a current source supplying i number of currents each having a different current ratio; a switching unit determining a current quantity to be supplied to a feedback capacitor by adjusting a turn-on quantity of each of the i number of currents according to the pulse width of each of the i number of pulse signals; and an electric charge quantity regulation unit charging DC offset electric charges corresponding to current supplied from the switching unit through the feedback capacitor and transferring the DC offset electric charges charged in the feedback capacitor to a sampling capacitor through a rotary capacitor, to allow the sampling capacitor to primarily store the DC offset electric charges and then secondarily store electric charges corresponding to an input signal.

11 Claims, 9 Drawing Sheets

DC OFFSET CANCELLATION CIRCUIT

CROSS-REFERENCE TO RELATED APPLICATIONS

This application claims the priorities of Korean Patent Application Nos. 10-2009-0112802 filed on Nov. 20, 2009 and 10-2010-0026184 filed on Mar. 24, 2010, in the Korean Intellectual Property Office, the disclosures of which are incorporated herein by reference.

BACKGROUND OF THE INVENTION

1. Field of the Invention

The present invention relates to a DC offset cancellation circuit and more particularly, to a DC offset cancellation circuit for a discrete time receiver capable of minutely adjusting a DC offset and extending a DC offset adjustment range.

2. Description of the Related Art

Because a discrete time filter involves the occurrence of an LO (Local Oscillator) leakage and includes a switch and a capacitor, a DC offset is easily generated, so the discrete time filter requires a supplementary circuit such as a DC offset cancellation circuit in order to cancel the DC offset, and in this case, it is very significant for the supplementary circuit to operate such that it does not affect a main operation of the filter.

FIG. 1 is a first example of a DC offset cancellation circuit according to the related art. In the DC offset cancellation circuit illustrated in FIG. 1, it is noted that both a mixer 12 and a current source 14 include directly connected sampling capacitors Ch1 and Ch2.

The sampling capacitors Ch1 and Ch2 in FIG. 1 are directly provided with an output signal from the mixer 12 and current of the current source 14, and in this case, noise generated from the current source 14 is directly added to the output signal from the mixer 12, degrading the noise performance of the mixer 12.

Also, when switches SWlop and SWlom of the mixer 12 are turned on, a trans-conductance terminal of the mixer 12 and the current source 14 simultaneously operate, making isolation between the two circuits blown up to thereby degrade the performance of the trans-conductance terminal of the mixer 12 and the current source 14.

A pair of transmission switches SWd1 and SWdb1 transfer electric charges charged in the sampling capacitors Cf1 and Cf2 to rotary capacitors Cr1 and Cr2 by transmission signals (D1, $\overline{D}$) to form an IIR (Infinite Impulse Response) filter.

Thus, in order to overcome the shortcomings of the noise increase, a DC offset calculation circuit configured by correcting the part after the mixer 12, as shown in FIG. 2, has been proposed.

In the DC offset cancellation circuit illustrated in FIG. 2, a pair of feedback capacitors Cf1 and Cf2 are additionally provided, and the current source 14 is connected to the feedback capacitors Cf1 and Cf2.

The feedback capacitors Cf1 and Cf2 receive current from the current source 14 and primarily store DC offset electric charges, and rotary capacitors Cr21 and Cr22 then transfer them to the sampling capacitors Ch1 and Ch2.

In this case, the rotary capacitors Cr21 and Cr22 are provided so as to perform charge sharing in order to transfer the DC offset electric charges charged in the feedback capacitors Cf1 and Cf2 to the sampling capacitors Ch1 and Ch2, and at this time, an IIR filtering function is conducted in the rotary capacitors Cr21 and Cr22. As a result, noise from the current source 14 is filtered out and only the DC offset electric charges are transferred to the sampling capacitors Ch1 and Ch2.

Also, in the DC offset cancellation circuit illustrated in FIG. 2, the values of the feedback capacitors Cf1 and Cf2 can be arbitrarily determined, irrespective of the sampling capacitors Ch1 and Ch2 and the rotary capacitors Cr21 and Cr22, having the advantage in that the bandwidth of the IIR filter that filters out noise of the current source 14 and a cut-off frequency can be adjusted according to an operator's intent.

In addition, as mentioned above, because the DC offset electric charges are transferred to the sampling capacitors Ch1 and Ch2 through the feedback capacitors Cf1 and Cf2 and the rotary capacitors Cr21 and Cr22, isolation between the trans-conductance stage of the mixer 12 and the current source 14 can be stably guaranteed.

However, in order to obtain DC offset electric charges in the DC offset cancellation circuit of FIG. 2, the current output from the current source 14 implemented mainly as a current type digital-to-analog converter (current DAC) is charged to the feedback capacitors Cf1 and Cf2 during a certain period of time. In this case, in order to minutely adjust the DC offset electric charges, the resolution of the current type digital-to-converter must be increased, a factor that makes the designing thereof complicated and difficult.

In an effort to solve this problem, a method of replacing the current source part in the structure of FIG. 2 with a sigma-delta converter 31 and using two constant voltage sources VDD and GND as shown in FIG. 3 has been proposed.

The DC offset cancellation circuit illustrated in FIG. 3 has the advantage in that DC offset electric charges can be generated at finer intervals and noise characteristics can be further improved owing to noise shaping characteristics of the sigma-delta converter 31.

However, also, in this case, in order to obtain high resolution and sufficient noise shaping characteristics, the sigma-delta converter 31 must receive a clock (CLK) having a very high frequency.

As a result, in order to minutely adjust the DC offset in the related art, the current type digital-to-analog converter having high resolution or the sigma-delta converter using the high frequency clock must be provided, and this makes the designing of the DC offset cancellation circuit complicated and difficult.

SUMMARY OF THE INVENTION

An aspect of the present invention provides a DC offset cancellation circuit capable of minutely adjusting a DC offset without a current type digital-to-analog converter having high resolution or a sigma-delta converter using a high frequency clock.

Another aspect of the present invention provides a DC offset cancellation circuit capable of extending a DC offset adjustment range.

Another aspect of the present invention provides a DC offset cancellation circuit having low-noise characteristics.

According to an aspect of the present invention, there is provided a DC offset cancellation circuit including: a control signal generation unit generating i (i is a natural number) number of pulse signals having a pulse width corresponding to a DC offset amount; a current source supplying i number of currents each having a different current ratio; a switching unit determining a current quantity to be supplied to a feedback capacitor by adjusting a turn-on quantity of each of the i number of currents according to the pulse width of each of the i number of pulse signals; and an electric charge quantity regulation unit charging DC offset electric charges corresponding to current supplied from the switching unit through the feedback capacitor and transferring the DC offset electric charges charged in the feedback capacitor to a sampling capacitor through a rotary capacitor, to allow the sampling capacitor to primarily store the DC offset electric charges and then secondarily store electric charges corresponding to an input signal.

The control signal generation unit may include: a control value determination unit generating a polarity selection signal having a value corresponding to the polarity of a DC offset and i number of delay amount selection signals having bit values corresponding to the amount of the DC offset; a delay chain generating n (n is a natural number) number of delay signals, each having a different delay amount, from a reference clock; a delay amount selection unit selectively outputting i number of delay signals having a delay amount corresponding to bit value of each of the i number of delay amount selection signals among the n number of delay signals; and a pulse signal generation unit generating i number of pulse signals by adjusting the pulse width of the reference clock according to the delay amount of each of the i number of delay signals.

The control signal determination unit may be implemented as an up/down counter receiving an up signal and a down signal indicating the amount and polarity of a DC offset from a DC offset detection circuit and counting them, and generating the polarity selection signal and the i number of delay amount selection signals.

The delay chain may include a plurality of delay cells connected in series.

The delay amount selection unit may include i number of multiplexers receiving one of the n number of delay signals and the i number of delay amount selection signals and selectively outputting only one of the n number of delay signals according to the received delay amount selection signal.

The switching unit may include: i number of switches determining a current quantity to be supplied to the feedback capacitor by adjusting a turn-on quantity of each of the i number of currents according to the pulse width of each of the i number of pulse signals; and a polarity selection switch adding currents turned on through the i number of switches and supplying the same to a feedback capacitor having the polarity corresponding to the polarity selection signal.

The electric charge quantity regulation unit may include: a DC offset adjustment circuit having a pair of feedback capacitors that receives current through the polarity selection switch and charges positive (+) or negative (−) polarity DC offset electric charges; a first switch capacitor filter circuit connected to one capacitor charging the positive (+) polarity DC offset electric charges among the pair of feedback capacitors; and a second switch capacitor filter circuit connected to the other capacitor charging the negative (−) polarity DC offset electric charges among the pair of feedback capacitors.

Each of the first and second switch capacitor filter circuits may include: the sampling capacitor receiving the DC offset electric charges charged in the feedback capacitor and primarily storing the same during a precharge operation, and then secondarily storing electric charges corresponding to an input signal; and the rotary capacitor connected between the feedback capacitor and the sampling capacitor, and transferring the DC offset electric charges charged in the feedback capacitor to the sampling capacitor during the precharge operation, and transferring the electric charges charged in the sampling capacitor to the exterior during a lead-out operation.

Each of the first and second switch capacitor filter circuits may further include: a precharge switch connecting the feedback capacitor and the rotary capacitor during the precharge operation; a reset switch connecting the rotary capacitor to a ground during a reset operation; and a lead-out switch outputting electric charges from the sampling capacitor transferred through the rotary capacitor to the exterior during the lead-out operation.

Each of the first and second switch capacitor filter circuits may sequentially perform the lead-out operation, the reset operation, and the precharge operation.

The DC offset cancellation circuit may further include: a current converter converting the input signal from a voltage signal to a current signal; and a mixer mixing an output from the current converter with a local oscillation signal and applying the same to the sampling capacitor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

As the present invention allows for various changes and numerous embodiments, particular embodiments will be illustrated in drawings and described in detail in the written description.

However, this is not intended to limit the present invention to particular modes of practice, and it is to be appreciated that all changes, equivalents, and substitutes that do not depart from the spirit and technical scope of the present invention are encompassed in the present invention.

While such terms as "first" and "second," etc., may be used to describe various components, such components must not be limited to the above terms. The above terms are used only to distinguish one component from another. For example, a first component may be referred to as a second component without departing from the scope of the rights of the present invention, and likewise, a second component may be referred to as a first component.

When a component is mentioned to be "connected" to or "accessing" another component, this may mean that it is directly connected to or accessing the other component, but it is to be understood that another component may exist in-between. On the other hand, when a component is mentioned as being "directly connected" to or "directly accessing" another component, it is to be understood that there are no other components in-between.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted to have meanings equal to the contextual meanings in the relevant field of art, and are not to be interpreted to have ideal or excessively formal meanings unless clearly defined in the present application.

Embodiments of the present invention will be described below in detail with reference to the accompanying drawings, where those components are rendered the same reference number that are the same or correspond to, regardless of the figure number, and redundant explanations are omitted.

Figure 1:
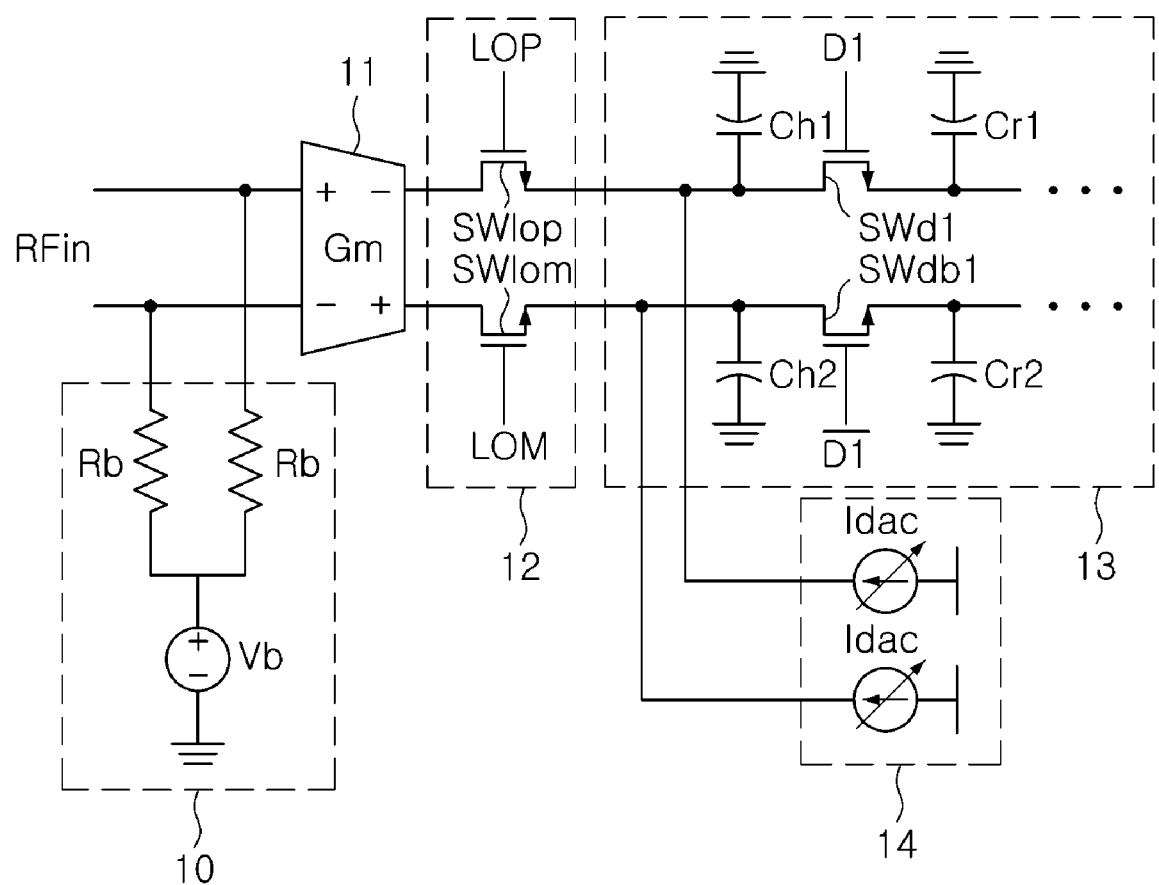
FIG. 1 is a circuit diagram showing a first type DC offset cancellation circuit according to the related art.
Figure 2:
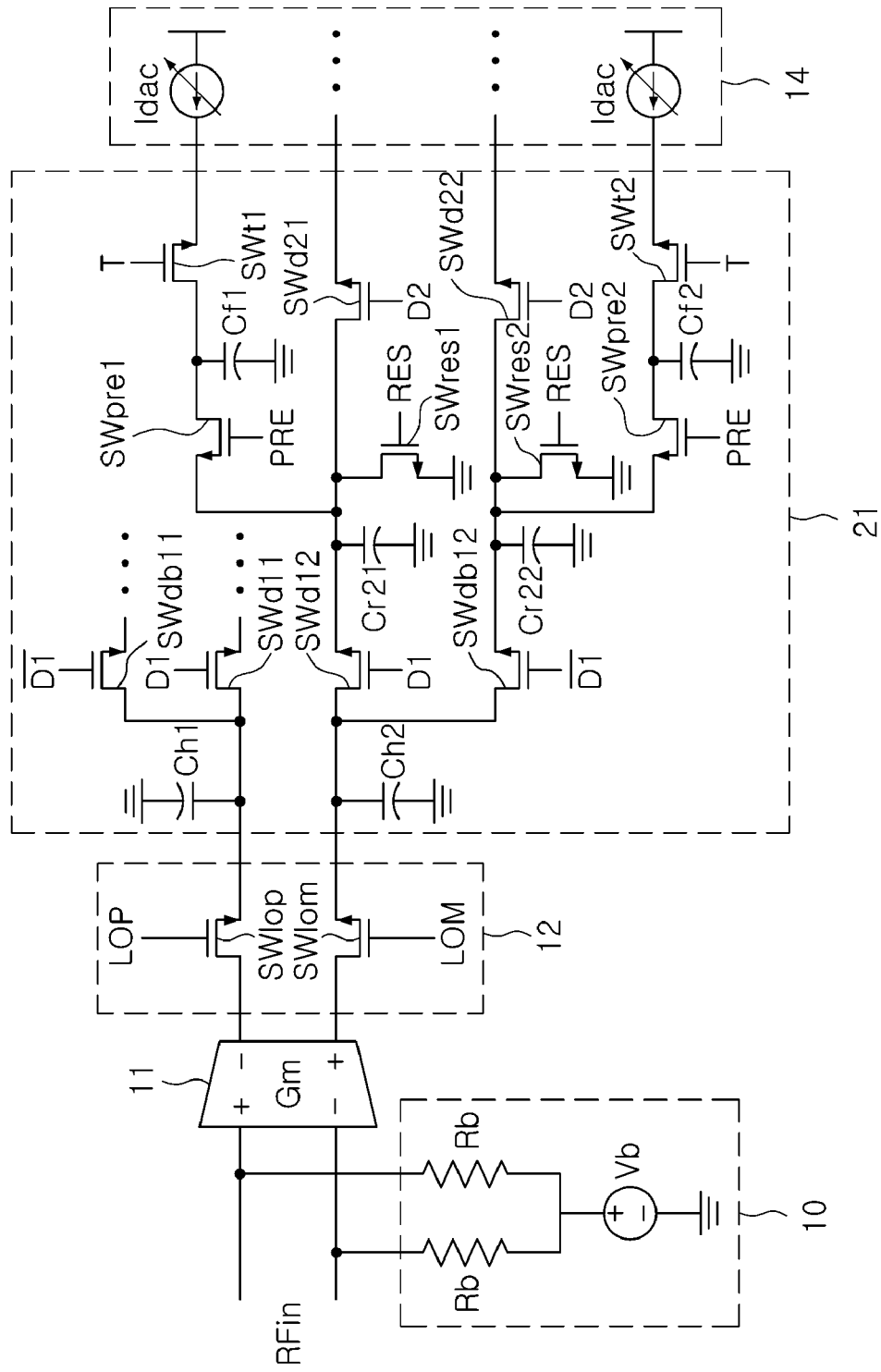
FIG. 2 is a circuit diagram showing a second type DC offset cancellation circuit according to the related art.
Figure 3:
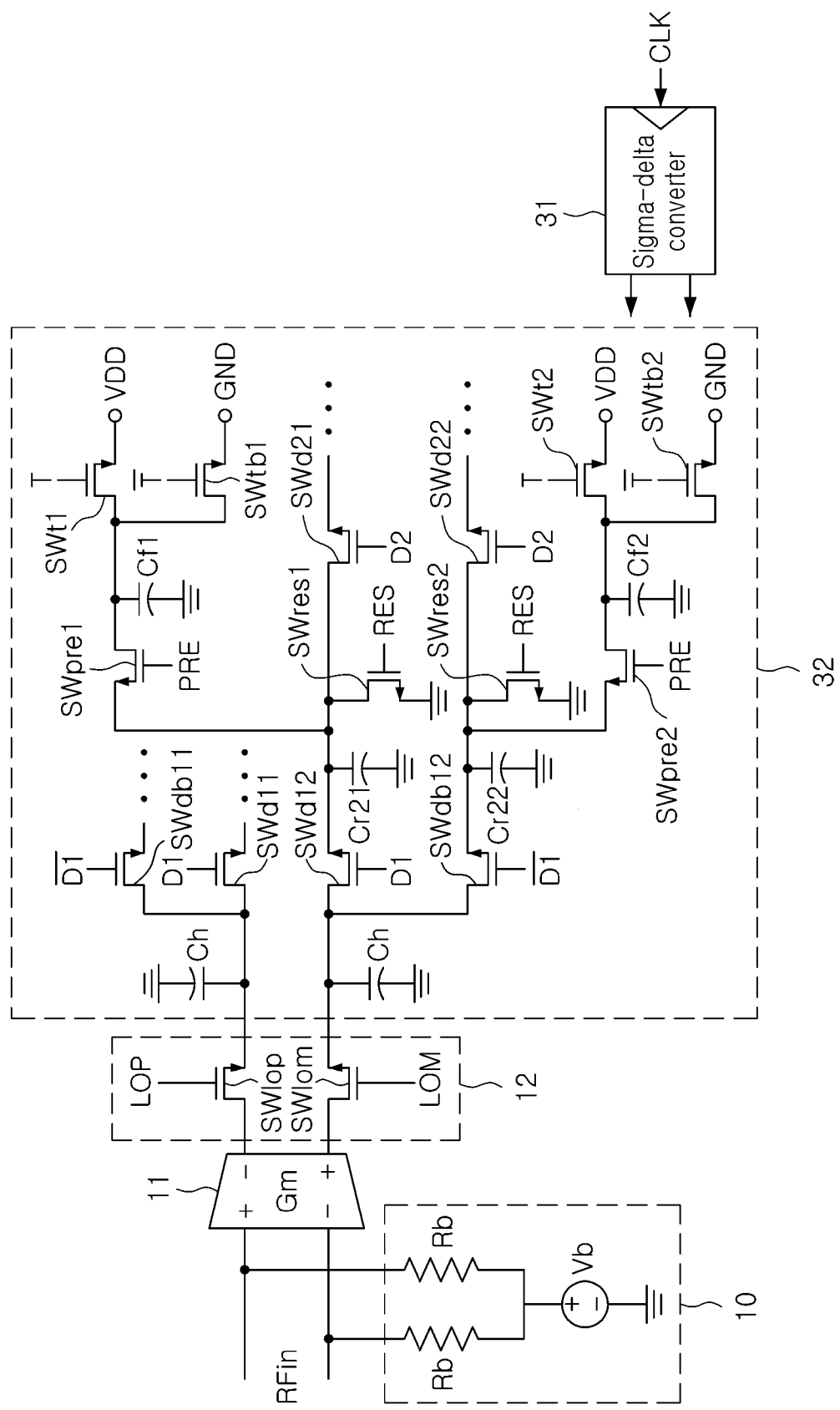
FIG. 3 is a circuit diagram showing a third type DC offset cancellation circuit according to the related art.
Figure 4:
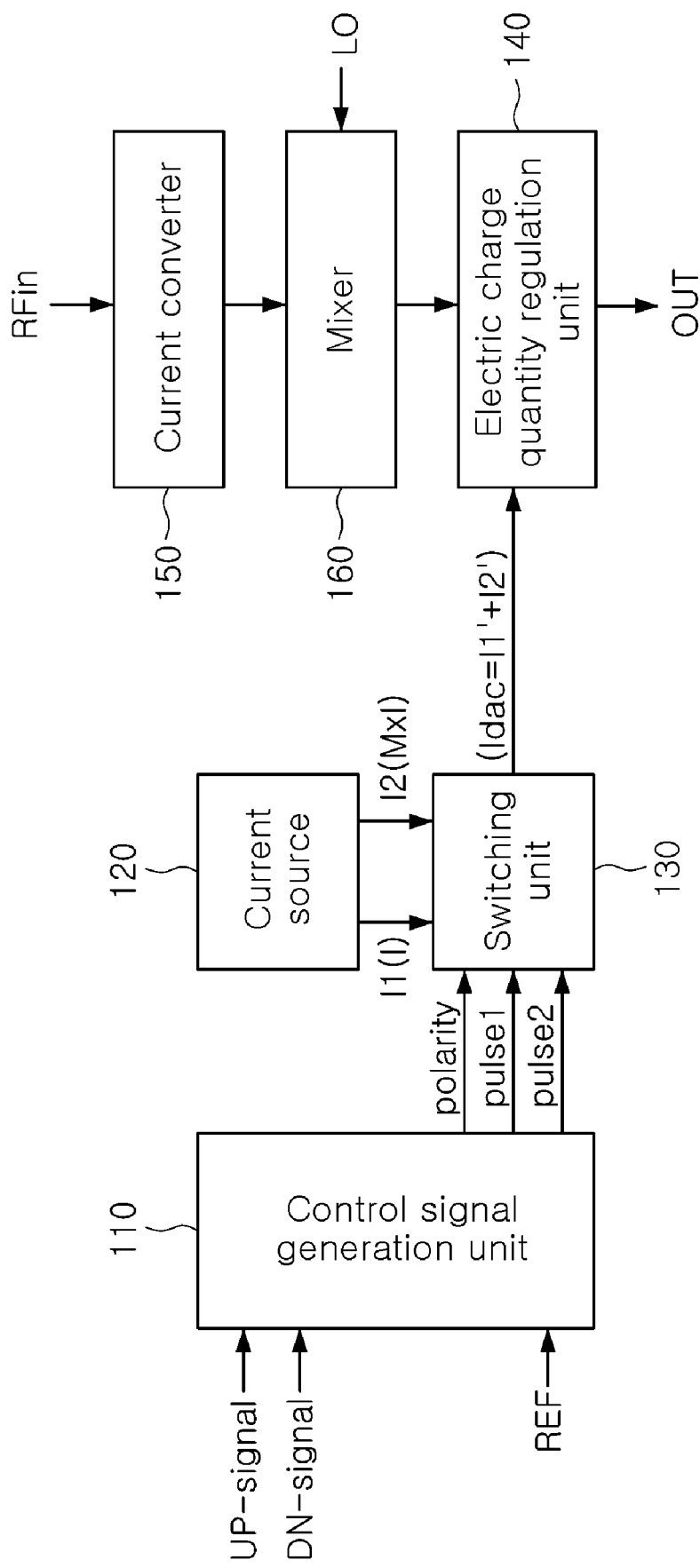
FIG. 4 is a schematic block diagram of a DC offset cancellation circuit according to an exemplary embodiment of the present invention.

FIG. 4 is a schematic block diagram of a DC offset cancellation circuit according to an exemplary embodiment of the present invention.

With reference to FIG. 4, the DC offset cancellation circuit according to an exemplary embodiment of the present invention includes a control signal generation unit 110, a current source 120, a switching unit 130, an electric charge quantity regulation unit 140, a current converter 150, and a mixer 160. The DC offset cancellation circuit according to an exemplary embodiment of the present invention recognizes the amount and polarity of a DC offset included in a currently input signal RFin by using an up signal and a down signal provided from a DC offset detection circuit that detects and notifies about a DC offset.

For reference, in general, the DC offset detection circuit compares the voltage of the currently input signal RFin with a reference voltage to detect the amount and polarity of the DC offset included in the input signal RFin and provides the up signal or the down signal having a corresponding value.

The control signal generation unit 110 receives a control signal informing about the amount and polarity of the DC offset from the DC offset detection circuit, generates first and second pulse signals (pulse1 and pulse2) having a pulse width corresponding to the DC offset amount and a polarity selection signal (polarity) having a value corresponding to the polarity of the DC offset, and outputs them.

The current source 120 supplies two currents I1 and I2, each having a different current ratio. For example, the current source 120 may supply the first current I1 having a current value I and the second current I2 having a current value M×I (M is a natural number). The reason for supplying the two currents I1 and I2 each having a different current ratio by the current source 120 is to extend an available current range to '0~(M+1)×I', and thus, also to extend a DC offset adjustment range of the DC offset cancellation circuit to '0~(M+1)×I'.

The switching unit 130 determines a current quantity (Idac=I1'+I2') to be supplied to a feedback capacitor by regulating a turn-on quantity of each of the first and second currents I1 and I2 according to the pulse width of each of the first and second pulse signals (pulse1 and pulse2).

If the pulse widths of the first and second pulse signals (pulse1 and pulse2) provided from the control signal generation unit 110 can be adjusted by n stages, the current quantity (Idac=I1'+I2') supplied to the feedback capacitor can be regulated by 2×n stages within the range of '0~(M+1)×I'. Namely, the switching unit 130 can minutely regulate the current quantity of the current (Idac=I1'+I2') to be supplied to the feedback capacitor according to the pulse width of each of the first and second pulse signals (pulse1 and pulse2).

Also, the switching unit 130 selects the polarity of the DC offset electric charges according to the polarity selection signal (polarity) with respect to the current (Idac=I1'+I2') having the adjusted current quantity. For example, when the polarity selection signal (polarity) indicates that the polarity of the DC offset is positive (+), the switching unit 130 may provide the current (Idac) to a feedback capacitor that charges DC offset electric charges having a positive (+) polarity, and when the polarity selection signal (polarity) indicates that the polarity of the DC offset is negative (−), the switching unit 130 may provide the current (Idac) to a feedback capacitor that charges DC offset electric charges having a negative (−) polarity.

The electric charge quantity regulation unit 140 charges the DC offset electric charges corresponding to the current (Idac) supplied from the switching unit 130 through the feedback capacitor and transfers the DC offset electric charges charged in the feedback capacitor to a sampling capacitor through a rotary capacitor, so that the sampling capacitor can primarily store the DC offset electric charges and then secondarily stores charges corresponding to the input signal. Also, the electric charge quantity regulation unit 140 outputs the electric charges charged in the sampling capacitor to an external circuit (e.g., an analog-to-digital converter) through the rotary capacitor.

The current converter 150 converts the form of the input signal (RFin) from a voltage signal to a current signal as in the related art, and also, the mixer 160 mixes an output from the current converter 150 with a local oscillation (LO) signal in response to a mixer control signal (LOP) and applies the same to the sampling capacitor, as in the related art.

In this manner, the DC offset cancellation circuit according to an exemplary embodiment of the present invention generates a plurality of pulse signals having a pulse width that can be adjusted by n stages, and regulates a current quantity supplied to the feedback capacitor from a current source such that the current quantity is regulated by 2×n stages by using the plurality of pulse signals. Thus, the DC offset can be minutely adjusted without the necessity of using a current type digital-to-analog converter having high resolution or the sigma-delta converter using a high frequency clock.

Also, because the current source provides a plurality of currents each having a different current ratio, the changeable current range can be extended.

In addition, because the DC offset electric charges of the feedback capacitor are transferred to the sampling capacitor through the rotary capacitor, the IIR filtering function can be generated in the rotary capacitor to filter out the noise of the current source added to an in-band signal stored in the sampling capacitor.

Figure 5:
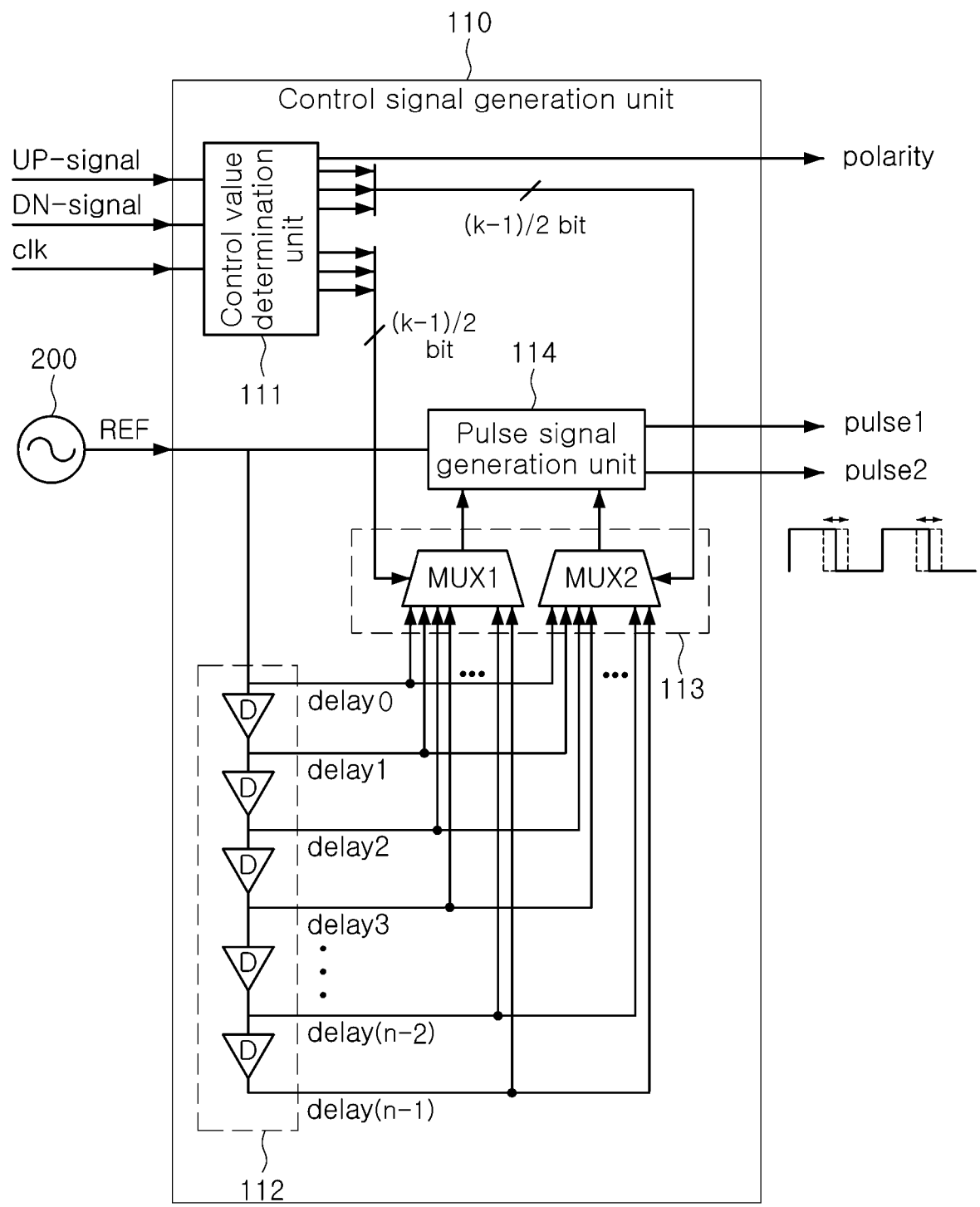
FIG. 5 is a detailed block diagram of a control signal generation unit according to an exemplary embodiment of the present invention.

FIG. 5 is a detailed block diagram of the control signal generation unit according to an exemplary embodiment of the present invention.

With reference to FIG. 5, the control signal generation unit 110 includes a control value determination unit 111, a delay chain 112, a delay amount selection unit 113, and a pulse signal generation unit 114.

The control value determination unit 111 counts the up signal (UP_signal) and down signal (DN_signal) indicating the amount and polarity of the DC offset provided from the DC offset detection circuit (not shown), generates the polarity selection signal (polarity) having a value corresponding to the polarity of the DC offset and first and second delay amount selection signals (sel1 and sel2) each having a bit value corresponding to the DC offset, and outputs the same.

In this case, when the DC offset has a positive (+) polarity (namely, when the DC offset is to be increased), the polarity selection signal (polarity), a 1-bit signal, may have a value 1, and when the DC offset has a negative (−) polarity (namely, when the DC offset is to be decreased), the polarity selection signal (polarity) may have a value 0. The first and second delay amount selection signals (sel1 and sel2), including j bits (j is a natural number), may have a bit value corresponding to the DC offset.

In addition, the control value determination unit 111 may be implemented as an up/down counter that counts the up signal (UP_signal) and down signal (DN_signal) and outputs a count result signal of k bits (k is a natural number), and in this case, the most significant 1 bit of the k-bit count result signal may be used as the polarity selection signal (polarity), the next higher (k−1)/2 bits may be used as a first delay amount selection signal (sel1), and the remaining lower (k−1)/2 bits may be used as a second delay amount selection signal (sel2), respectively.

The delay chain 112, in which a plurality of delay cells (D) having a delay component are connected in series, delays a reference clock REF generated by a reference clock generator 200 through the plurality of delay cells (D) to generate a plurality of delay signals (delay0~delay(n−1)) each having a different delay amount, and outputs the same.

The delay amount selection unit 113 includes two multiplexers MUX1 and MUX2 that selectively output one of the plurality of delay signals (delay0~delay(n−1)) according to the first or second delay amount selection signal sel1 or sel2. The delay amount selection unit 113 selects two delay signals each having a delay amount corresponding to a bit value of each of the first and second delay amount selection signals sel1 and sel2.

Table 1 below shows an operational example of the delay amount selection unit 113. Specifically, Table 1 shows a delay amount selection signal sel1 or sel2 implemented as a 3-bit signal and the examples of delay signals and delay amounts selected by the delay amount selection unit 113 according to the bit value of the delay selection signals sel1 and sel2 in the case of eight delay signals.

TABLE 1

| Delay amount selection signal (Binary code) | Selected delay signal | Selected delay amount (ps) |
| --- | --- | --- |
| 000 | delay0 (REF) | 0 |
| 001 | delay1 | 140 |

TABLE 1-continued

| Delay amount selection signal (Binary code) | Selected delay signal | Selected delay amount (ps) |
| --- | --- | --- |
| 010 | delay2 | 314 |
| 011 | delay3 | 487 |
| 100 | delay4 | 660 |
| 101 | delay5 | 834 |
| 110 | delay6 | 1010 |
| 111 | delay7 | 1180 |

Namely, the multiplexers MUX1 and MUX2 included in the delay amount selection unit 113 selectively output delay signals each having a delay amount corresponding to the bit values of the delay amount selection signals sel1 and sel2.

The pulse signal generation unit 114 receives the two delay signals selected through the delay amount selection unit 113 and the reference clock REF and adjusts the pulse width of the reference clock (REF) according to a delay amount of each of the two delay signals to generate two pulse signals (pulse1 and pulse2) each having a pulse width corresponding to the delay amount of each of the two delay signals.

In other words, the pulse signal generation unit 114 minutely adjusts the respective pulse widths of the first and second pulse signals (pulse1 and pulse2) by fragmenting them by the number (n) of delay signals, and the current quantity of the current (Idac=I1'+I2') supplied to the feedback capacitor can be also fragmented according to the pulse widths of the first and second pulse signals (pulse1 and pulse2). As a result, the feedback capacitor of the DC offset adjustment circuit 141 can fragment the DC offset electric charges and charge the same.

The operation of the control signal generation unit 110 will now be described with reference to FIG. 5.

First, the control signal generation unit 110 generates the plurality of delay signals (delay0~delay(n−1)) each having a different delay amount through the delay chain 112, and the control value determination unit 111 generates the polarity selection signal (polarity) having a value corresponding to the DC offset polarity and the first and second delay amount selection signals (sel1 and sel2) each having a bit value corresponding to the DC offset amount and outputs the same.

Then, the first multiplexer MUX1 provided in the delay amount selection unit 113 receives the plurality of delay signals (delay0~delay(n−1)) and the first delay amount selection signal (sel1) and selectively outputs one delay signal having a delay amount corresponding to the bit value of the first delay amount selection signal (sel1) among the plurality of delay signals (delay0~delay(n−1)). At the same time, the second multiplexer MUX2 receives the plurality of delay signals (delay0~delay(n−1)) and the second delay amount selection signal (sel2) and selectively outputs one delay signal having a delay amount corresponding to the bit value of the second delay amount selection signal (sel2) among the plurality of delay signals (delay0~delay(n−1)).

Namely, the two multiplexers (MUX1 and MUX2) provided in the delay amount selection unit 113 selectively output delay signals corresponding to the first and second delay amount selection signals (sel1 and sel2).

Then, the pulse signal generation unit 114 generates the first pulse signal (pulse1) by adjusting the pulse width of the reference clock (REF) according to an output signal from the first multiplexer (MUX1) and the second pulse signal (pulse2) by adjusting the pulse width of the reference clock (REF) according to an output signal from the second multiplexer (MUX2).

Accordingly, the first and second pulse signals (pulse1 and pulse2) generated by the pulse signal generation unit 114 have the pulse width corresponding to the delay amount selected by the first and second delay amount selection signals (sel1 and sel2), respectively.

For reference, a minimum delay time provided by the delay cell D is gradually reduced as the technique of a circuit element fabrication process is advancing, so the pulse widths of the two pulse signals (pulse1 and pulse2) can be more minutely adjusted.

Thus, in an exemplary embodiment of the present invention, the regulation of the current quantity provided to the feedback capacitor of the DC offset adjustment circuit 141 by using the pulse widths of the two pulse signals (pulse1 and pulse2) can end up with a minute regulation of even the DC offset electric charges charged in the feedback capacitor.

Figure 6:
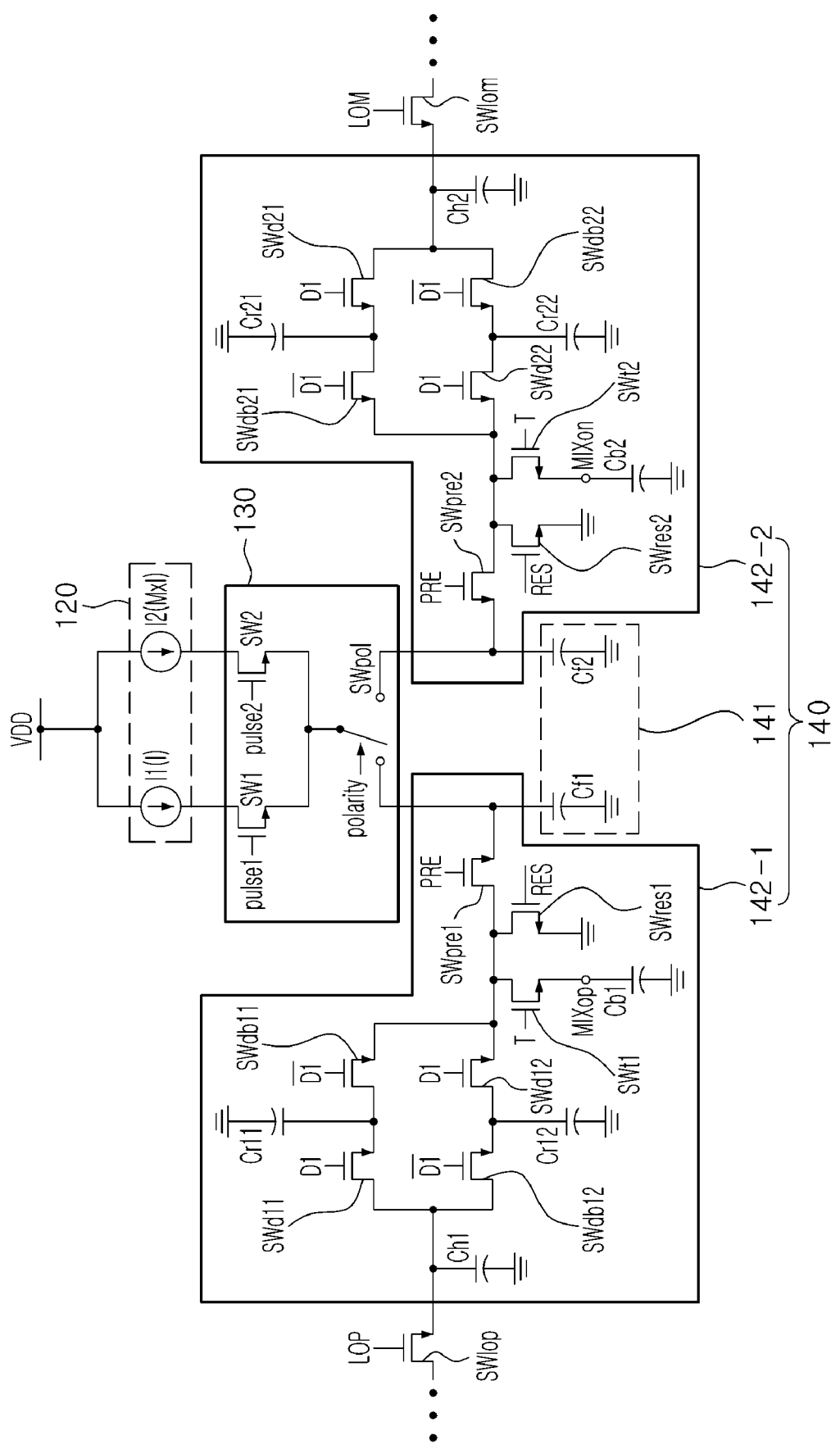
FIG. 6 is a circuit diagram showing a detailed configuration of a switching unit and an electric charge quantity regulation unit according to an exemplary embodiment of the present invention.

FIG. 6 is a circuit diagram showing a detailed configuration of the switching unit and the electric charge quantity regulation unit according to an exemplary embodiment of the present invention.

With reference to FIG. 6, the switching unit 130 includes a first switch SW1 that varies a turn-on quantity of the first current (I1) according to the pulse width of the first pulse signal (pulse1) (namely, the first switch SW1 varies a turn-on duration (or a current turn-on duration) according to the pulse width of the first pulse signal (pulse1)), a second switch SW2 that varies a turn-on quantity of the second current (I2) according to the pulse width of the second pulse signal (pulse2) (namely, the second switch SW2 varies a turn-on duration according to the pulse width of the second pulse signal (pulse2)), and a polarity selection switch SWpol that adds the currents (Idac=I1'+I2') turned on through the first and second switches SW1 and SW2 and supplies the sum to the feedback capacitor having a polarity corresponding to the polarity selection signal (polarity).

The electric charge quantity regulation unit 140 includes a DC offset adjustment circuit 141 including a pair of feedback capacitors Cf1 and Cf2, a first switch capacitor filter circuit 142-1 connected to one (Cf2) of the pair of feedback capacitors, and a second switch capacitor filter circuit 142-2 connected to the other (Cf2) of the pair of feedback capacitors.

DC offset electric charges, having a positive (+) polarity, are charged through one (Cf1) of the pair of feedback capacitors, and DC offset electric charges, having a negative (−) polarity, are charged through the other (Cf2) of the pair of feedback capacitors.

The first and second switch capacitor filter circuits 142-1 and 142-2 include sampling capacitors Ch1 and Ch2 connected to the mixer switches SWlop and SWlom, respectively, receiving electric charges charged in the feedback capacitors Cf1 and Cf2, and primarily storing them during a precharge operation, and then, secondarily storing electric charges corresponding to the input signal RFin transferred through the mixer switches SWlop and SWlom, rotary capacitors Cr11/Cr12 and Cr21/Cr22 connected between the sampling capacitors Ch1 and Ch2 and the feedback capacitors Cf1 and Cf2, and transferring the electric charges charged in the feedback capacitors Cf1 and Cf2 to the sampling capacitors Ch1 and Ch2 during the precharge operation and transferring the electric charges charged in the sampling capacitor Ch to buffer capacitors Cb1 and Cb2 during a lead-out operation, and the buffer capacitor Cb1 and Cb2 charging electric charges transferred to the rotary capacitors Cr11/Cr12 and Cr21/Cr22 and outputting the charged electric charges to an external circuit during the lead-out operation.

The first and second switch capacitor filter circuits 142-1 and 142-2 may further include precharge switches SWpre1 and SWpre2 transferring the electric charges charged in the feedback capacitors Cf1 and Cf2 to the rotary capacitors Cr11/Cr12 and Cr21/Cr22 during the precharge operation, reset switches SWres1 and SWres2 connecting the rotary capacitors Cr11/Cr12 and Cr21/Cr22, which have performed the lead-out operation during a reset operation, to grounds, and lead-out switches SWt1 and SWt2 transferring the electric charges of the sampling capacitors Ch1 and Ch2 transferred through the rotary capacitors Cr11/Cr12 and Cr21/Cr22 to the buffer capacitors Cb1 and Cb2 during the lead-out operation.

The first and second switch capacitor filter circuits 142-1 and 142-2 may further include pairs of transmission switches (SWd11/SWdb11), (SWd12/SWdb12), and (SWd21/SWdb21, SWd22/SWdb22) connected between the sampling capacitors Ch1 and Ch2 and the rotary capacitors Cr11/Cr12 and Cr21/Cr22 and between the rotary capacitors Cr11/Cr12 and Cr21/Cr22 and the precharge switches (SWpre1, SWpre2), respectively, in order to connect the sampling capacitors Ch and the rotary capacitors (Cr11/Cr12, Cr21/Cr22) or connect the rotary capacitors (Cr11/Cr12, Cr21/Cr22) and the precharge switches (SWpre1, SWpre2) according to a pair of transmission signals (D1, $\overline{D}$).

Preferably, the first and second switch capacitor filter circuits 142-1 and 142-2 sequentially perform the lead-out operation, the reset operation, and the precharge operation, respectively.

Figure 7:
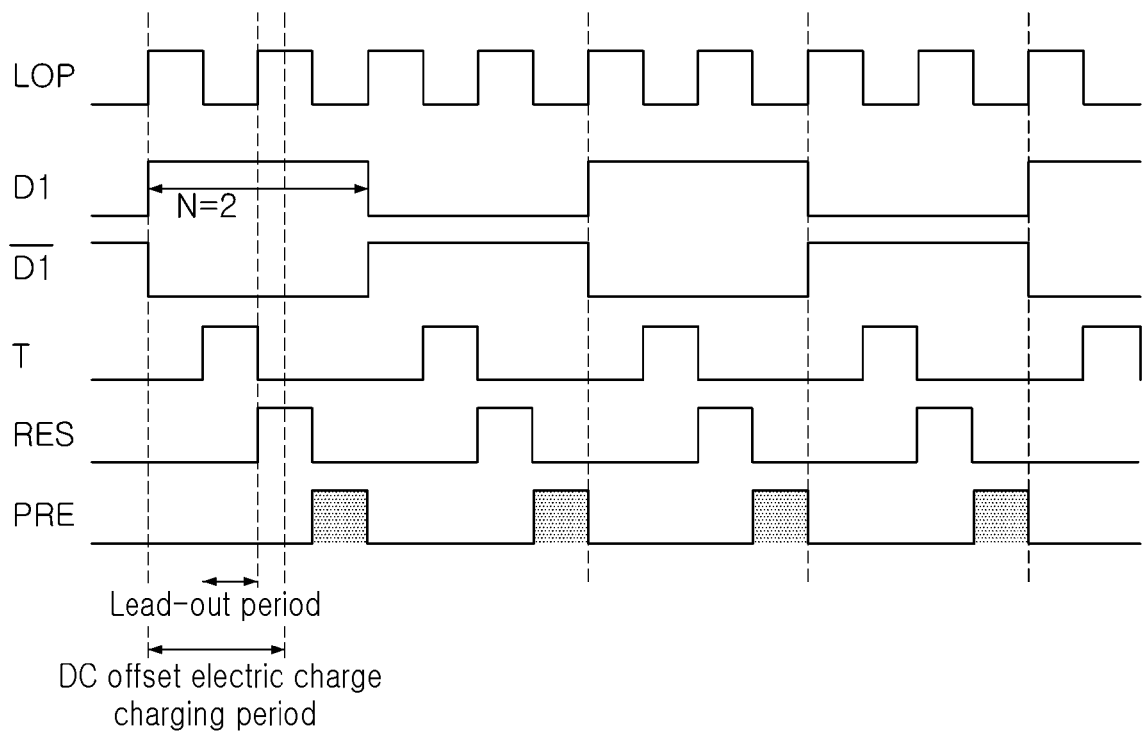
FIG. 7 is a view of a control signal timing of a DC offset cancellation circuit when a decimation ratio is 2 according to an exemplary embodiment of the present invention.
Figure 8:
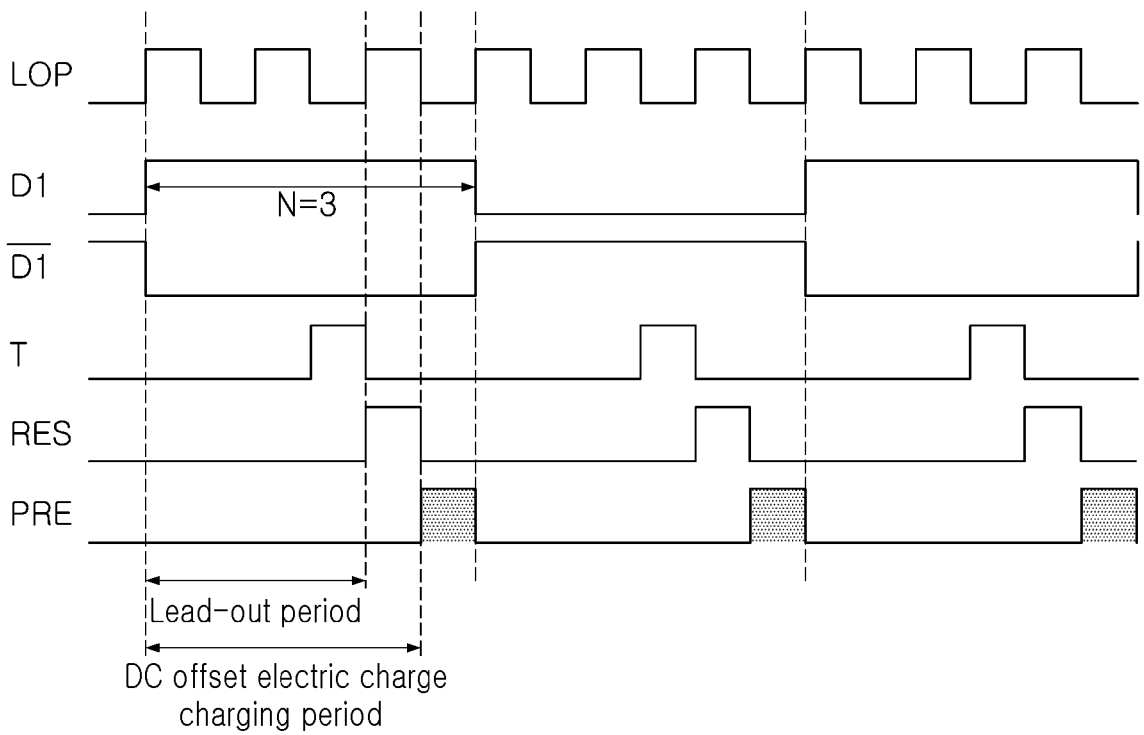
FIG. 8 is a view of a control signal timing of a DC offset cancellation circuit when a decimation ratio is 3 according to an exemplary embodiment of the present invention.

The switching unit and the electric charge quantity regulation unit according to an exemplary embodiment of the present invention configured as described above were designed based on the case in which decimation ratios are 2 and 3, and control signal timings of the both cases are as shown in FIGS. 7 and 8.

As for the cases shown in FIGS. 7 and 8, although the decimation ratios are different, their operational principle of the switching unit and the electric charge quantity regulation unit are the same, so in the present invention, only the case of the decimation ratio 2 will now be described.

With reference to FIGS. 7 and 8, the operations of the switching unit and the electric charge quantity regulation unit when the decimation ratio is 2 are as follows.

First, with reference to FIG. 7, it is noted that, when the decimation ratio is 2, a DC offset cancellation loop operates during two periods of the mixer control signal (LOP). Also, it is noted that, the pair of transmission signals (D1, $\overline{D}$) have a period double that of the mixer control signal (LOP), and a lead-out signal (T), a reset signal (RES) and a precharge signal (PRE) are sequentially clocked.

When the pair of transmission signals (D1, $\overline{D}$) is in a first state (namely, when the non-inverted transmission signal (D1) has a high level and the inverted transmission signal ($\overline{D}$) has a low level), the electric charges charged in the sampling capacitors Ch1 and Ch2 are transferred to one (e.g., Cr11 and Cr21) of the pairs of rotary capacitors (Cr11/Cr12, Cr21/Cr22) (sampling operation).

In this state, when the lead-out signal (T) transitions to have a high level, the other (Cr12 and Cr22) of the pairs of rotary capacitors (Cr11/Cr12, Cr21/Cr22) transfers the electric charges of the sampling capacitors Ch1 and Ch2, which have been provided through a previous sampling operation, to the buffer capacitors Cb1 and Cb2, and the buffer capacitors Cb1 and Cb2 output the received electric charges to an external circuit such as an analog-to-digital converter (lead-out operation).

Subsequently, when the reset signal (RES) transitions to have a high level, the other (Cr12 and Cr22) of the pairs of rotary capacitors (Cr11/Cr12, Cr21/Cr22) is connected to grounds so as to be reset. Namely, the rotary capacitors Cr12 and Cr22, which have performed the lead-out operation, are reset (reset operation).

Meanwhile, while the foregoing operations are being performed, the switching unit 130 varies the current quantity of the current (Idac=I1'+I2') supplied to the feedback capacitor according to the pulse width of the first and second pulse signals (pulse1 and pulse2), applies the varied current quantity to one of the pair of feedback capacitors Cf1 and Cf2 according to the polarity selection signal (polarity) to allow the DC offset charges to be charged in one of the pair of feedback capacitors (Cf1 and Cf2) (operation of charging DC offset electric charges).

Subsequently, when the reset operation is completed and the precharge operation is activated, the reset signal transitions to have a low level and the precharge signal transitions to have a high level. Then, the switching unit 130 transfers the DC offset electric charges charged in one of the pair of feedback capacitors Cf1 and Cf2 to the other (Cr12 and Cr22) of the pairs of rotary capacitors (Cr11/Cr12, Cr21/Cr22) (namely, the switching unit 130 transfers the DC offset electric charges charged in one of the pair of feedback capacitors Cf1 and Cf2 to the rotary capacitors which have performed the reset operation).

Thereafter, when the pair of transmission signals (D1, $\overline{D}$) are changed to a second state (namely, when the non-inverted transmission signal D1 has a low level value and the inverted transmission signal ($\overline{D}$) has a high level value), the sampling capacitors Ch1 and Ch2 receive the DC offset electric charges through the other rotary capacitors (Cr12 and Cr22), primarily store them, and then secondarily store electric charges corresponding to the input signals transmitted through the mixer switches SW1op and SW1om.

Follow-up operations are performed in the same manner as described above, so a description thereof will be omitted.

In this manner, in the DC offset cancellation circuit configured and operated as described above according to an exemplary embodiment of the present invention, the DC offset can be minutely adjusted according to the pulse width of each of the plurality of pulse signal, and because the DC offset electric charges of the feedback capacitor are transferred to the sampling capacitor through the rotary capacitor, the isolation between the trans-conductance of the mixer and the current source can be stably secured and noise of the current source added to the in-band signal stored in the sampling capacitor can be filtered out.

In addition, because the values of the feedback capacitors are arbitrarily determined, irrespective of the sampling capacitors and the rotary capacitors, the frequency bandwidth of the filter and the cut-off frequency can be adjusted according to an operator's intent.

Figure 9:
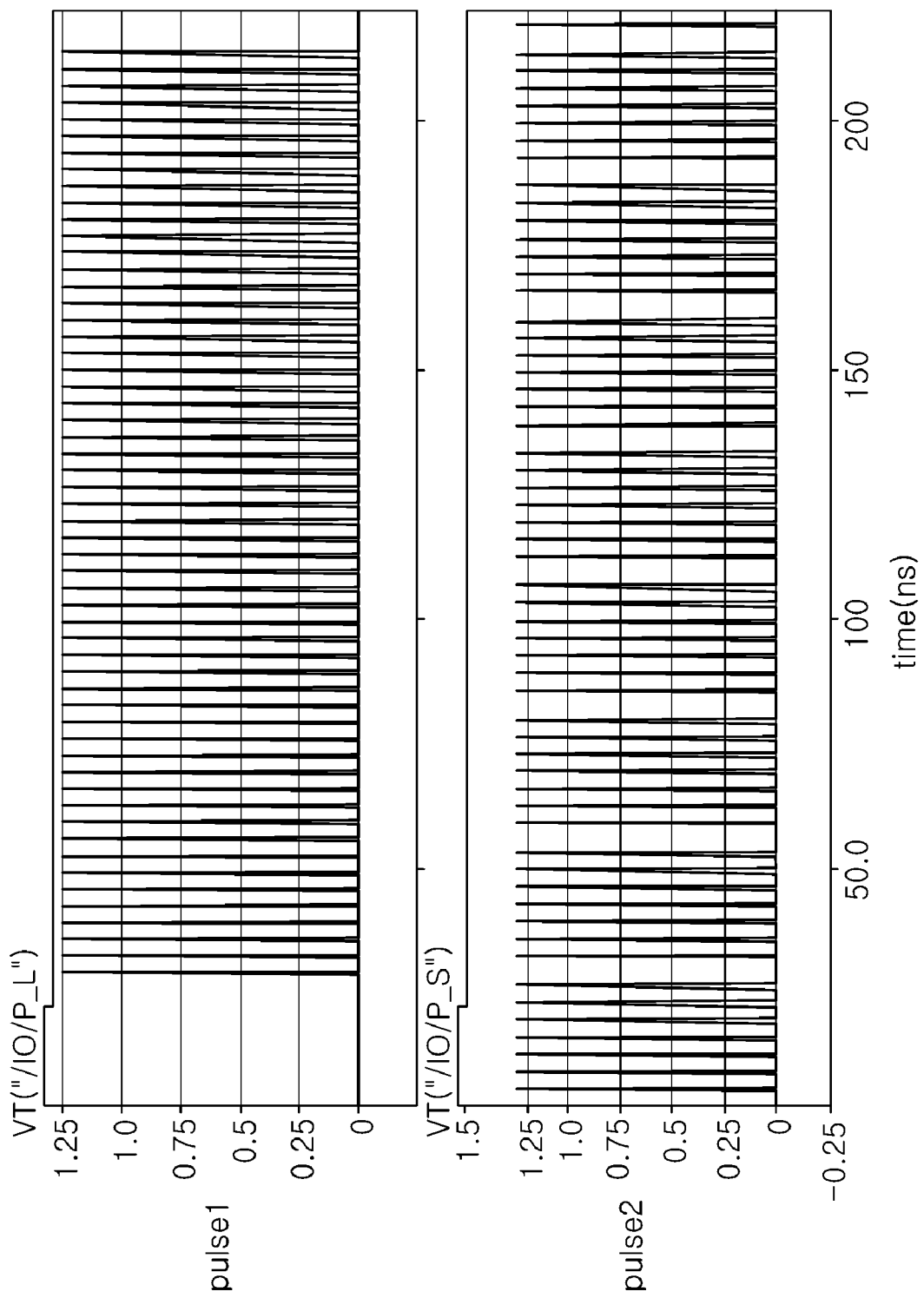
FIG. 9 illustrates examples of first and second pulse signals generated according to an exemplary embodiment of the present invention.

FIG. 9 illustrates examples of first and second pulse signals generated according to an exemplary embodiment of the present invention. With reference to FIG. 9, it is noted that the pulse width of each of the first and second pulse signals (pulse1 and pulse2) are adjusted according to a code value of each of the first and second delay amount selection signals (sel1 and sel2). Namely, the pulse widths of the first and second pulse signals (pulse1 and pulse2) can be adjusted according to the first and second delay amount selection signals (sel1 and sel2) as shown in Table 1 above.

Figure 10:
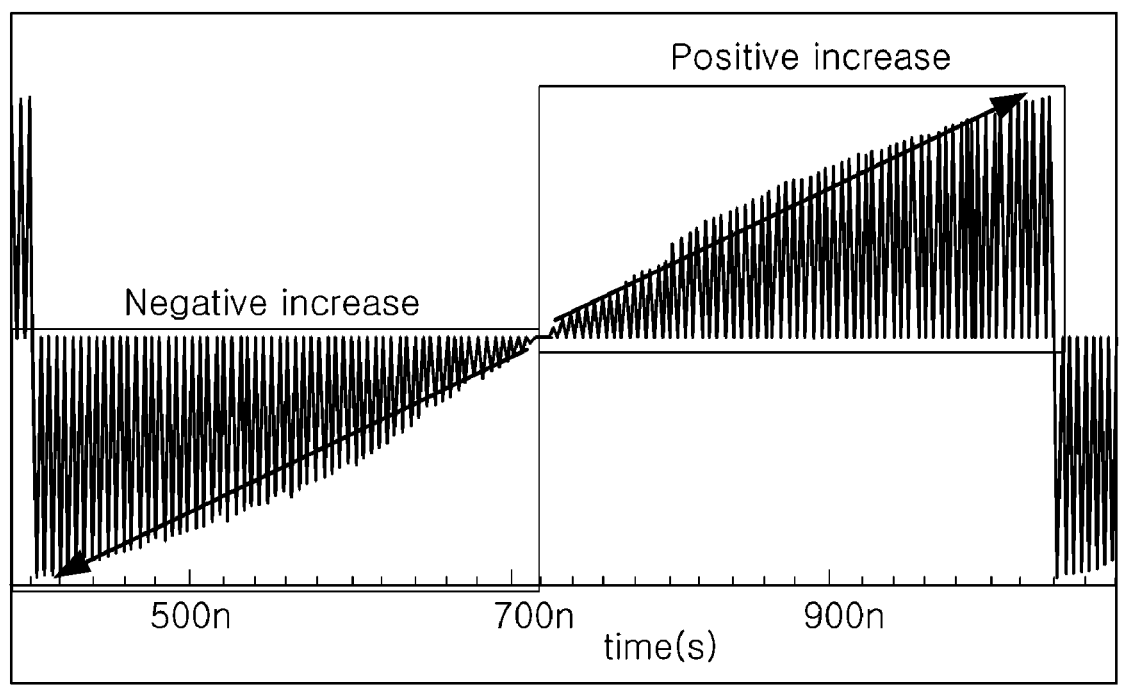
FIG. 10 is a graph showing simulation results of the DC offset cancellation circuit according to an exemplary embodiment of the present invention.

FIG. 10 is a graph showing simulation results of the DC offset cancellation circuit according to an exemplary embodiment of the present invention. As shown in FIG. 10, although there is a slight error at the interval in which a charge time of the current source 120 changes, it is noted that the quantity of electric charges charged in the feedback capacitor (Cf) changes linearly according to the code values of the first and second delay amount selection signals (sel1 and sel2).

In the above description, the current quantity supplied to the feedback capacitor is varied by using two pulse signals and two currents, but the present invention is not limited thereto, and in an actual application, the number of pulse signals and currents can be varied according to types and characteristics of circuits to which the DC offset cancellation circuit according to an exemplary embodiment of the present invention is applied.

As set forth above, according to exemplary embodiments of the invention, the DC offset cancellation circuit generates a plurality of pulse signals having a pulse width that can be adjusted by n stages, and regulates a current quantity supplied to the feedback capacitor from a current source such that the current quantity is regulated by 2×n stages by using the plurality of pulse signals. Thus, the DC offset can be minutely adjusted without the necessity of using a current type digital-to-analog converter having high resolution or the sigma-delta converter using a high frequency clock.

Also, because the current source provides a plurality of currents each having a different current ratio, the changeable current range can be extended.

In addition, because the DC offset electric charges of the feedback capacitor are transferred to the sampling capacitor through the rotary capacitor, the IIR filtering function can be generated in the rotary capacitor to filter out noise of the current source added to an in-band signal stored in the sampling capacitor.

While the present invention has been shown and described in connection with the exemplary embodiments, it will be apparent to those skilled in the art that modifications and variations can be made without departing from the spirit and scope of the invention as defined by the appended claims.

What is claimed is:

1. A DC offset cancellation circuit comprising:
a control signal generation unit generating i (i is a natural number) number of pulse signals having a pulse width corresponding to a DC offset amount;
a current source supplying i number of currents each having a different current ratio;
a switching unit determining a current quantity to be supplied to a feedback capacitor by adjusting a turn-on quantity of each of the i number of currents according to the pulse width of each of the i number of pulse signals; and
an electric charge quantity regulation unit charging DC offset electric charges corresponding to current supplied from the switching unit through the feedback capacitor and transferring the DC offset electric charges charged in the feedback capacitor to a sampling capacitor through a rotary capacitor, to allow the sampling capacitor to primarily store the DC offset electric charges and then secondarily store electric charges corresponding to an input signal.

2. The circuit of claim 1, wherein the control signal generation unit comprises:
a control value determination unit generating a polarity selection signal having a value corresponding to the polarity of a DC offset and i number of delay amount selection signals having bit values corresponding to the amount of the DC offset;
a delay chain generating n (n is a natural number) number of delay signals, each having a different delay amount, from a reference clock;
a delay amount selection unit selectively outputting i number of delay signals having a delay amount corresponding to bit value of each of the i number of delay amount selection signals among the n number of delay signals; and a pulse signal generation unit generating i number of pulse signals by adjusting the pulse width of the reference clock according to the delay amount of each of the i number of delay signals.

3. The circuit of claim 2, wherein the control signal determination unit is implemented as an up/down counter receiving an up signal and a down signal indicating the amount and polarity of a DC offset from a DC offset detection circuit and counting them, and generating the polarity selection signal and the i number of delay amount selection signals.

4. The circuit of claim 2, wherein the delay chain comprises a plurality of delay cells connected in series.

5. The circuit of claim 2, wherein the delay amount selection unit comprises i number of multiplexers receiving one of the n number of delay signals and the i number of delay amount selection signals and selectively outputting only one of the n number of delay signals according to the received delay amount selection signal.

6. The circuit of claim 2, wherein the switching unit comprises:

i number of switches determining a current quantity to be supplied to the feedback capacitor by adjusting a turn-on quantity of each of the i number of currents according to the pulse width of each of the i number of pulse signals; and a polarity selection switch adding currents turned on through the i number of switches and supplying the same to a feedback capacitor having the polarity corresponding to the polarity selection signal.

7. The circuit of claim 6, wherein the electric charge quantity regulation unit comprises:

a DC offset adjustment circuit having a pair of feedback capacitors that receives current through the polarity selection switch and charges positive (+) or negative (−) polarity DC offset electric charges;

a first switch capacitor filter circuit connected to one capacitor charging the positive (+) polarity DC offset electric charges among the pair of feedback capacitors; and a second switch capacitor filter circuit connected to the other capacitor charging the negative (−) polarity DC offset electric charges among the pair of feedback capacitors.

8. The circuit of claim 7, wherein each of the first and second switch capacitor filter circuits comprises:

the sampling capacitor receiving the DC offset electric charges charged in the feedback capacitor and primarily storing the same during a precharge operation, and then secondarily storing electric charges corresponding to an input signal; and the rotary capacitor connected between the feedback capacitor and the sampling capacitor, and transferring the DC offset electric charges charged in the feedback capacitor to the sampling capacitor during the precharge operation, and transferring the electric charges charged in the sampling capacitor to the exterior during a lead-out operation.

9. The circuit of claim 8, wherein each of the first and second switch capacitor filter circuits further comprises:

a precharge switch connecting the feedback capacitor and the rotary capacitor during the precharge operation;

a reset switch connecting the rotary capacitor to a ground during a reset operation; and a lead-out switch outputting electric charges from the sampling capacitor transferred through the rotary capacitor to the exterior during the lead-out operation.

10. The circuit of claim 8, wherein each of the first and second switch capacitor filter circuits sequentially performs the lead-out operation, the reset operation, and the precharge operation.

11. The circuit of claim 1, further comprising:

a current converter converting the input signal from a voltage signal to a current signal; and a mixer mixing an output from the current converter with a local oscillation signal and applying the same to the sampling capacitor.

* * * * *